(12) United States Patent
Inoue et al.

(10) Patent No.: US 8,485,507 B2
(45) Date of Patent: Jul. 16, 2013

(54) MOVABLE TABLE AND PROCESSING STAGE

(75) Inventors: Yuya Inoue, Chigasaki (JP); Hisato Tanaka, Chigasaki (JP); Tamotsu Tanifuji, Chigasaki (JP)

(73) Assignee: Ulvac, Inc., Chigasaki-Shi (JP)

( * ) Notice: Subject to any disclaimer, the term of this patent is extended or adjusted under 35 U.S.C. 154(b) by 392 days.

(21) Appl. No.: 12/742,177

(22) PCT Filed: Nov. 11, 2008

(86) PCT No.: PCT/JP2008/070524
§ 371 (c)(1),
(2), (4) Date: May 10, 2010

(87) PCT Pub. No.: WO2009/063877
PCT Pub. Date: May 22, 2009

(65) Prior Publication Data
US 2010/0276858 A1    Nov. 4, 2010

(30) Foreign Application Priority Data

Nov. 13, 2007    (JP) ................................ P2007-294402

(51) Int. Cl.
*B23B 1/25*    (2006.01)
(52) U.S. Cl.
USPC .................................. 269/55; 269/21; 483/1
(58) Field of Classification Search
USPC .................... 269/55, 60, 21, 20, 281.1, 281.5
See application file for complete search history.

(56) References Cited

U.S. PATENT DOCUMENTS 4,761,876 A * 8/1988 Kosmowski ...................... 483/1

FOREIGN PATENT DOCUMENTS

| JP | 60-14824 | 1/1985 |
|----|----------|--------|
| JP | 07-311375 | 11/1995 |
| JP | 2005-114882 | 4/2004 |
| JP | 2004-172319 | 6/2004 |
| KR | 10-0598196 | 12/2004 |

OTHER PUBLICATIONS

International Search Report from corresponding PCT Application No. PCT/JP2008/070524 dated Jan. 27, 2009.
Notice of Allowance from corresponding Korean Application No. 10-2010-7009655 dated Nov. 2, 2012. English translation attached.

* cited by examiner

*Primary Examiner* — Monica Carter
*Assistant Examiner* — Melanie Alexander
(74) *Attorney, Agent, or Firm* — Grossman, Tucker, Perreault & Pfleger, PLLC (57) ABSTRACT

A movable table, which has a substrate to be processed mounted thereon and moves, includes: a main plate formed of a metallic material; and a plurality of sub plates which is disposed on the main plate and is formed of a material with a hardness higher than the metallic material, and the top surfaces of the plurality of sub plates are mounting surfaces of the substrate to be processed.

6 Claims, 5 Drawing Sheets

MOVABLE TABLE AND PROCESSING STAGE

TECHNICAL FIELD

The present invention relates to a movable table and a processing stage.

Priority is claimed on Japanese Patent Application No. 2007-294402, filed on Nov. 13, 2007, the contents of which are incorporated herein by reference.

BACKGROUND ART

In manufacturing a device of good quality with a high yield, improvements in degree of accuracy of a position alignment are extremely important. For example, even in a case where a device is manufactured with low costs by the use of an inkjet method, an improvement in the degree of accuracy of the position alignment is desirable.

When a device is manufactured, there is known an XY stage as a means for executing a position alignment of a substrate which is a middle body of the device with a processing apparatus for executing a process thereto (for example, Patent Documents 1 and 2). The XY stage includes, for example, a mechanism that moves a movable table with a substrate to be processed mounted thereon along an X direction, and a mechanism that moves a process portion with the process apparatus installed thereon along a Y direction. It is hereby possible to execute a predetermined process in a predetermined position of the substrate to be processed while changing and controlling the relative position of the substrate to be processed and the process apparatus in the X direction and the Y direction.

In order to control the position of the substrate to be processed with a high degree of accuracy in the XY stage, it is important to increase a degree of flatness of a mounting surface of the substrate to be processed in the movable table. As a method of increasing the degree of flatness, a method of polishing a mounting surface side or the like using a material with a high hardness, for example, granite or the like used in a surface plate or the like is considered. In addition, in order to reduce the process speed by moving the movable table at a high speed, or in order to decrease the running cost of the XY stage, a lightening of the movable table is also important. In particular, since the substrate tends to be large depending on the device to be manufactured, in order to be able to cope with a large substrate, lightening of the movable table is desirable. As a method of lightening the movable table, for example, there is considered a method in which a metal with superior workability is used as a material and the metallic material is partly thinned.

[Patent Document 1] Japanese Unexamined Patent Application, First Publication No. H07-311375
[Patent Document 2] Japanese Unexamined Patent Application, First Publication No. 2005-114882

DISCLOSURE OF THE INVENTION

Problems to be Solved by the Invention

However, it is very difficult to increase the degree of flatness of the mounting surface in the movable table and lighten the movable table. For example, even when the granite or the like capable of increasing the degree of the flatness is used as the material and is attempted to be lightened by thinning, since a material with a high hardness has a low workability, it is difficult to satisfactorily work it. In addition, since, in many cases, the material with the high hardness is weak, crack or the like may be occurred during working. On the other hand, even when the material with the high workability is used as the material and is attempted to be highly flattened by polishing or the like, waves are generated on the surface of the material due to the deformation of the material and the residual stress or the like during working. Since the waves cannot be eliminated, it is impossible to obtain a high degree of flatness at the same level as the case where the granite is used as the material.

Thus, while a laminated structure of the granite material and the metallic material may be also considered, it is difficult to satisfactorily bond both of them. In other words, in order to satisfactorily bond both of them, it is required to increase the degree of flatness of both of them and then bond them, but it is difficult to increase the degree of flatness of the metallic material as described above. For that reason, the granite material cannot follow the waves of the metallic material and the granite material floats from the metallic material. In addition, for example, if an attempt is made to strongly press both of them each other so as to bond them by force, defects such as the splitting of the granite material and the deformation of the metallic material may occur. In addition, since the qualities of the materials of the granite material and the metallic material are different from each other, there is a danger that a defect such as bending of a movable table due to a difference in the deformation amounts caused by thermal expansion or the like may occur.

The present invention has been made in view of the above circumstances and an object thereof is to provide a movable table in which the degree of flatness of a mounting surface in the movable table is increased and which is lightened. Furthermore, another object of the present invention is to provide a satisfactory processing stage which includes the movable table.

Means for Solving the Problem (1) One aspect of the present invention adopts the following structure: a movable table, which has a substrate to be processed mounted thereon and moves, includes: a main plate formed of a metallic material; and a plurality of sub plates which is disposed on the main plate and is formed of a material with a hardness higher than the metallic material, and the top surfaces of the plurality of sub plates are mounting surfaces of the substrate to be processed.

If the main plate formed of the metallic material is used, the workability of the metallic material is high, therefore the metallic material can be easily partly thinned. Thus, the main plate can be lightened by thinning. In addition, if the sub plates, which are formed of materials having a hardness higher than the metallic material of the main plate, are used, as compared to a case where the sub plates are formed of the metallic material, the degree of flatness of the top surface thereof can be increased by means of the polishing or the like.

In addition, if the top surfaces of the plurality of sub plates are the mounting surfaces of the substrates to be processed, each of the sub plates is smaller than in a case where all of the mounting surfaces are constituted by one plate. Thus, the sub plates become relatively smaller with respect to the waves of the surface of the main plate, so it possible to make the sub plates follow the waves. Consequently, each of the sub plates can be satisfactorily bonded to the main plate. Herein, each of the sub plates follows the waves, thereby generating the waves on the top surfaces of the plurality of sub plates. However, by collectively polishing the top surface sides thereof after the main plate is bonded to the sub plates, the top surfaces of the sub plates can be approximately coplanar. In this manner, a movable table for which the degree of flatness of the mounting surface is high and the lightening is possible can be obtained.

(2) The above-described movable table may be configured as follows: the main plate is formed of an aluminum.

In this case, since the aluminum particularly has a low specific gravity and has a high workability among the metallic materials, the main plate can be satisfactorily lightened, thereby the lightweight movable table can be obtained.

(3) The above-described movable table may be configured as follows: the movable table further includes a fixing member which is installed on the mounting surface and detachably fixes the substrate to be processed.

In this case, the substrate to be processed, which is mounted on the movable table, is prevented from generating a deviation in the positions with respect to the movable table. Thus, it is possible to move the substrate to be processed to a desired position.

(4) The above-described movable table may be configured as follows: the fixing member fixes the substrate to be processed by reducing a pressure between the substrate to be processed and the mounting surface so that the substrate to be processed and the mounting surface are vacuum-fixed.

In a case where the substrate to be processed and the mounting surface are adsorbed by an electrostatic force or a magnetic force, it is necessary to prepare an electrification portion and a magnetic force generating portion or the like in the sub plates which come in contact with the substrate to be processed. In order to prepare the electrification portion and the magnetic force generating portion or the like, it is necessary to select a material having high workability for burying the metallic materials or metallic member as the materials of the sub plates.

However, if the substrate to be processed and the mounting surface are adsorbed by the pressure, the electrification portion and the magnetic force generating portion or the like are unnecessary, so the restriction of the materials of the sub plates necessary for installing the same is removed. Consequently, the material in which the degree of flatness can be easily increased, for example, by the polishing or the like can be adopted as the materials of the sub plates, thereby enabling a satisfactory sub plate with a high degree of flatness to be obtained.

(5) The above-described movable table may be configured as follows: the center portions of the sub plates are fixed to the main plate; the circumferential portions of the sub plates are movable in a plane direction of the main plate.

If the center portions of the sub plates are fixed to the main plate, the occurrence of the deviation in the positions of the sub plates with respect to the main plate is prevented. In addition, if the circumferential portions of the sub plates are movable in the plane direction of the main plate, it is possible to absorb the difference in the amounts of deformation due to the thermal expansion of the sub plates and the main plate. Thus, the distortion such as the bending of the sub plates and the main plate due to the difference in the amounts of deformation does not occur. For this reason, it is possible to prevent a deterioration of the degree of position accuracy of the substrate to be processed due to the distortion.

(6) The above-described movable table may be configured as follows: the sub plates are formed of a granite material.

In this case, it is possible to increase the degree of flatness of the sub plates depending on the method such as the polishing.

In one aspect of the present invention, the following structure is adopted: a processing stage includes: the above-described movable table; a process portion in which a process apparatus that performs a predetermined process for the substrate to be processed is installed; and a position control member which moves at least the movable table so as to change the relative positional relationship of the movable table and the process portion.

In this processing stage, as described above, since the degree of flatness of the mounting surface of the movable table is satisfactory, the substrate to be processed can be satisfactorily mounted on the mounting surface, which makes it possible to control the position of the substrate to be processed with a high degree of accuracy. In addition, since the movable table of the present invention is lightened, even when the driving force of usual capacity is used as the driving force for driving the same, the movable table can be moved at a high speed, which improves the throughput. In addition, in a case where the movable table is moved at the same speed as usual, the movable table is lightened and the inertial force thereof is small. For this reason, it is possible to control the position of the movable table with a high degree of accuracy. Furthermore, since an increase in the magnitude of the driving force accompanied by an increase in size of the movable table is decreased, the size of the movable table is easily increased. Thus, the processing stage is capable of coping with the larger substrate.

Effects of the Invention

According to the present invention, it is possible to increase the degree of flatness of the mounting surface of the substrate to be processed in the movable table and lighten the movable table. Thus, the costs relating to the mechanism for moving the movable table are decreased, so a processing stage can be obtained with low cost. Furthermore, by lightening the movable table, it is possible to move the movable table at a high speed and control the position of the movable table with a high degree of accuracy. As a consequence, it is possible to obtain a processing stage that is capable of executing the process for the substrate to be processed efficiently and satisfactorily. Thus, an increase in size of the movable table is easy to achieve and the processing stage can cope with the large substrate.

BRIEF DESCRIPTION OF THE REFERENCE SYMBOLS

10 FIRST RAIL
20 MOVABLE TABLE
21 MAIN PLATE
22 SUB PLATE
30 SUBSTRATE LIFTING MECHANISM
40 SECOND RAIL
50 PROCESS PORTION
100 XY STAGE (PROCESSING STAGE)

BEST MODE FOR CARRYING OUT THE INVENTION

Hereinafter, an embodiment of the present invention will be described, but the technical range of the present invention is not limited to the embodiment described later. In addition, various structures will be described with reference to the drawings in the following description, but in order to simply indicate the characteristic portions of the structures, the structures in the drawings may be indicated in such a manner that the sizes and the scales thereof are different from those of the actual structure.

Figure 1:
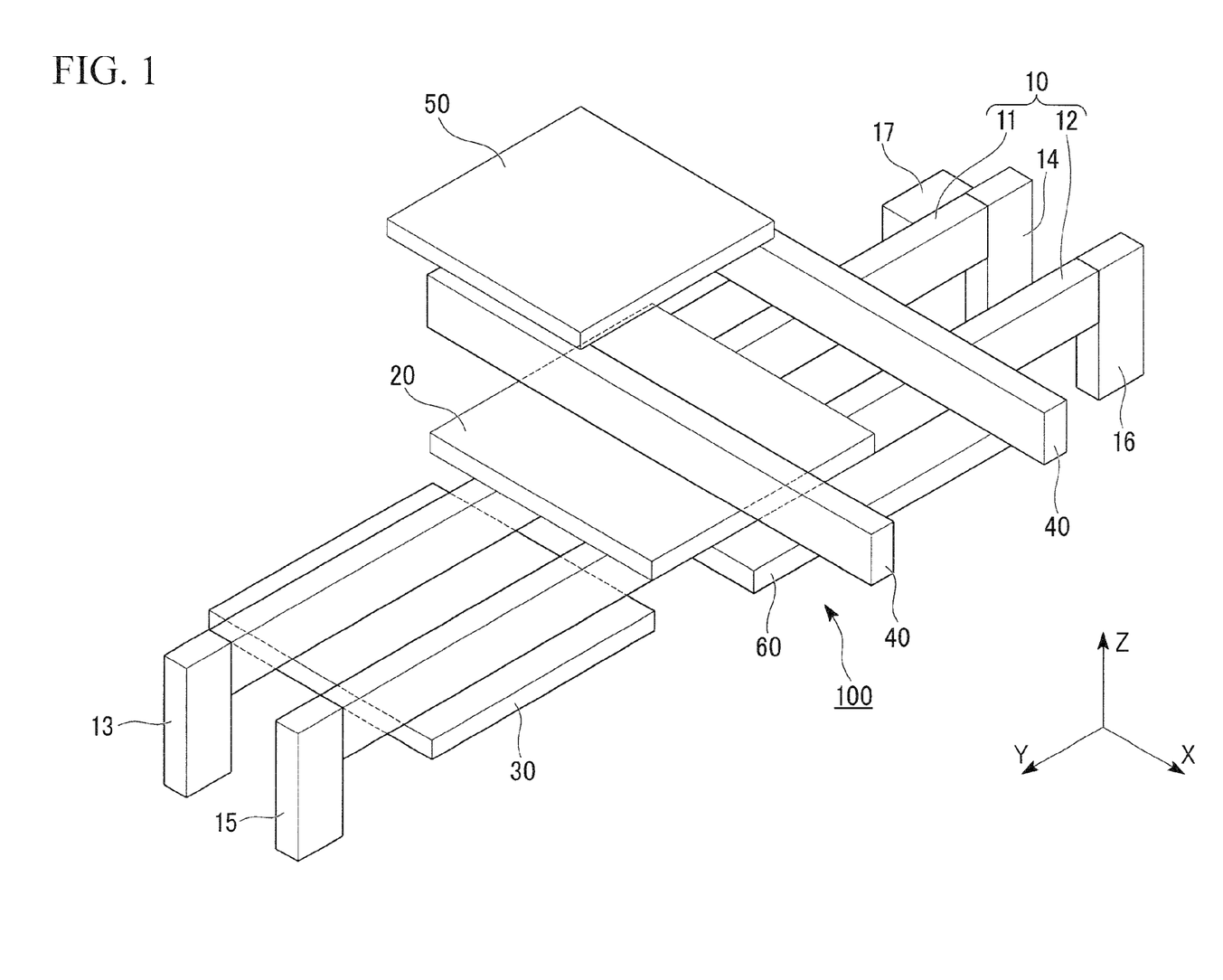
FIG. 1 is a perspective view that schematically shows a structure of a processing stage according to an embodiment of the present invention.

FIG. 1 is a perspective view that schematically shows an XY stage 100 which is an embodiment of a processing stage according to the present invention. As shown in FIG. 1, the XY stage 100 includes a first rail 10 that extends in a first direction (a Y direction), a movable table 20 that is disposed on the first rail 10, a substrate lifting mechanism 30 that is disposed at a lower side of an end of the first rail 10 in the Y direction, a second rail 40 that extends in a second direction (an X direction) at an upper side of the first rail 10, and a process portion 50 which is disposed on the second rail 40. In this manner, the XY stage 100 of the present embodiment adopts a structure in which the movable table 20 is independent from the substrate lifting mechanism 30.

The first rail 10 of the present invention includes two sub rails 11 and 12 that extend in the Y direction. The sub rail 11 is supported by support members 13 and 14 in both ends in the Y direction and the top surface side thereof is approximately horizontal. Similarly, the sub rail 12 is also supported by support members 15 and 16 and the top surface side thereof is approximately horizontal. A first direction control member 17 described later is established in the first rail 10 and serves as a guide for moving the movable table 20. In addition, the sub rails 11 and 12 include a base material formed of a granite such as a black granite or the like, for example, and a support frame formed of a metal or the like. The first rail 10 also serves as a frame of the XY stage 100.

The above-described granite is a stone, which is used for a processing stage and a surface plate, and is known to be extremely stable chemically and thermally. For that reason, by using the granite, it is possible to obtain the XY stage 100 which can be made to correspond to a process by the use of chemicals and a process accompanied by heat. In addition, since the granite is a material that has an extremely high hardness and a high Young's modulus, by the use thereof, it is possible to reduce the deterioration of the degree of the position accuracy due to the bending of the first rail 10.

A first direction control member 17 (position control member) is installed in the first rail 10, the movable table 20 is hereby moved to a predetermined position on the first rail 10, which makes it possible to control the position of the movable table 20 in the Y direction. In the present invention, the movable table 20 is moved by means of an air slider way. The first direction control member 17 includes a mechanism that sends air between the first rail 10 and the movable table 20 to float the movable table 20 from the first rail 10, a linear motor for moving the movable table 20, an apparatus for detecting the position of the movable table 20, and a control apparatus for controlling them or the like.

A stage 60 is installed at the lower side of the center portion of the first rail 10 in the Y direction. The stage 60 is an installation portion of various control devices and also serves as a foundation of the second rail 40 or the like. That is to say, a plurality of pillars 61 for supporting the second rail 40 is installed in the stage 60. The second rail 40 is installed on the pillars 61. A process portion 50 is disposed on the second rail 40. A liquid droplet discharging head (not shown) as the process apparatus is mounted on the process portion 50 of the present embodiment. A second direction control member (position control member) identical to the first direction control member 17 is installed in the second rail 40. The process portion 50 can be moved along the second rail 40. This enables the liquid droplet discharging apparatus disposed in the process portion 50 to move to a desired position in the X direction.

Figure 2A:
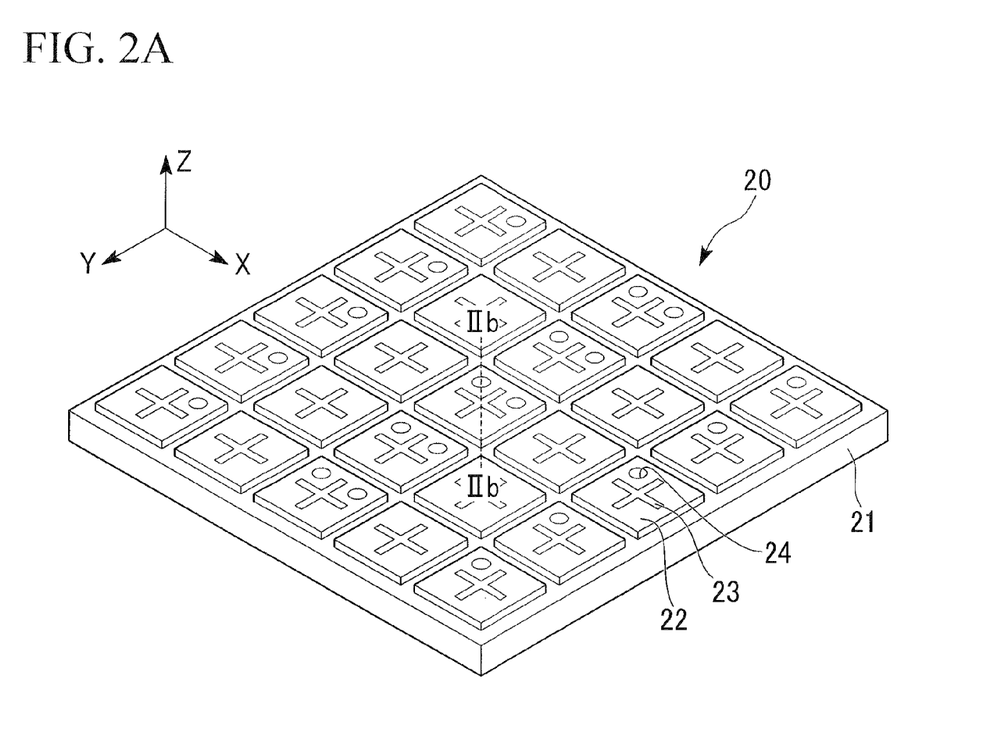
FIG. 2A is a perspective view that schematically shows the movable table according to the embodiment.

FIG. 2A is a perspective view that schematically shows the structure of the movable table 20. As shown in FIG. 2A, the movable table 20 includes a main plate 21 and a plurality of sub plates 22 that is disposed thereon. The top surfaces of the sub plates 22 are mounting surfaces for mounting the substrate to be processed thereon. In the present embodiment, the main plate 21 and the sub plates 22 are approximately square when seen from the plane view. Metallic materials such as aluminum, iron, stainless steel, brass, or the like can be used for the main plate 21, and the aluminum is adopted in the present embodiment. The size of the main plate 21 is such that one side of the square is about 2500 mm and the thickness thereof is about 80 mm.

The sub plates 22 are formed of the material having the hardness higher than that of the metallic material of the main plate 21, and the sub plates formed of the granite are adopted in the present embodiment. The sizes of the sub plates 22 are such that the sides of the square are about 500 mm and the thicknesses thereof are about 10 mm. Five sub plates 22 are disposed on the main plate 21 at equal distances side by side in the Y direction. These five rows are disposed at equal distances side by side in the X direction. The distances of the sub plates 22 are approximately 2 mm in both of the X direction and the Y direction. As described hereinafter (manufacturing example), the sub plates 22 are disposed on the main plate 21 and the top surfaces thereof are collectively polished. Thus, the degree of flatness between the top surfaces of the plurality of sub plates 22 is less than ±50 μm (equal to or larger than 0 μm) and the top surfaces of the plurality of sub plates 22 are approximately coplanar. In addition, in order for the substrate to be processed can be satisfactorily mounted, it is preferable that the degree of flatness be ±25 μm, and more preferably ±15 μm.

Concave portions 23 formed of grooves perpendicular to each other are installed on the top surface sides of the sub plates 22. The concave portions 23 are parts of a fixing member that fixes the substrate to be processed to the mounting surface in an attachable and detachable manner. The fixing member will be described hereinafter. In addition, a through hole 24 through the main plate 21 and the sub plates 22 is formed in the movable table 20. The through hole 24 is formed such that a lifting pin 31 described later can rise up to the upper side of the movable table 20 through the through hole 24. The through hole 24 is disposed so as not to be overlapped with the first rail 10 which is disposed at the bottom portion of the movable table 20. In the present embodiment, the first rails 10 are disposed at each of the bottom portions of the second row and the fourth row from the end of the one side in the X direction among the rows of the sub plates 22 arranged in the Y direction. For this reason, the through holes 24 are formed at the first row, the third row and the fifth row from the end of the one side in the X direction among the rows of the sub plates 22.

Figure 2B:
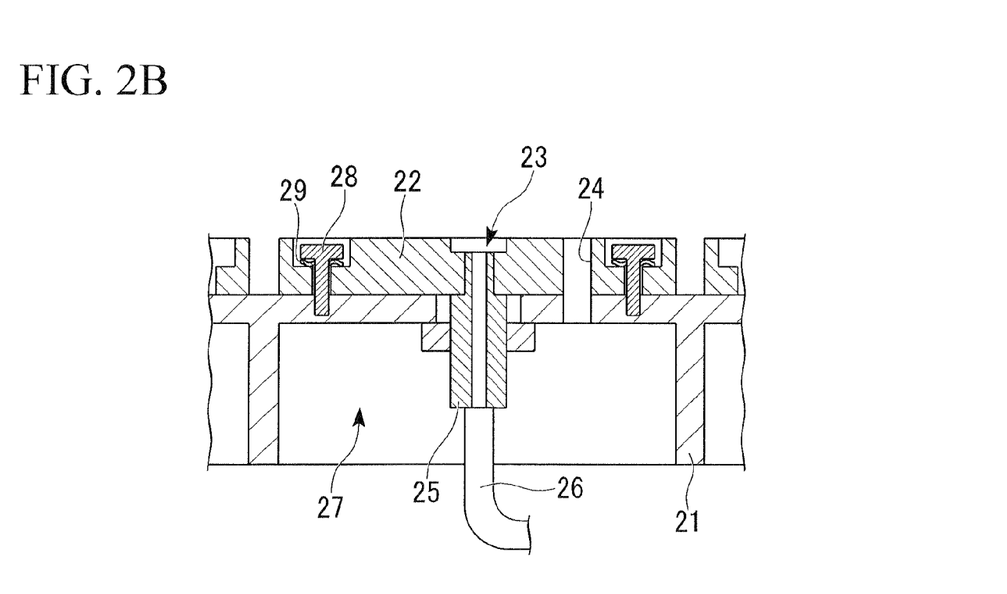
FIG. 2B is a sectional view of the principal portions of the movable table according to the embodiment.

FIG. 2B is a sectional view taken from line IIb-IIb in FIG. 2A. The structure of the movable table 20 will be described in more detail with reference to FIG. 2B. As shown in FIG. 2B, on the bottom surface of the main plate 21, the main plate 21 is partly thinned leaving a line-shaped rib, thereby forming a thin portion 27. The movable table 20 is hereby lightened. Furthermore, due to the rib structure described above, the strengths in the X direction and the Y direction of the movable table 20 can be secured. In the present embodiment, the main plate 21 is thinned such that about 70 mm is removed among the thickness (80 mm) of the main plate 21. In the thinned portion, the plate thickness of the top surface side of the main plate 21 is about 10 mm. In addition, the distance between the ribs may be an extent necessary for maintaining the strength of the movable table 20, and, for example, in a case where the material having the rigidity higher than the aluminum is used, by increasing the distance between the ribs, the thinned portion can be widened.

The sub plates 22 are fixed to the main plate 21 by means of a first fixing portion 25 disposed on the center portion thereof. By being fixed with a screw, or a bolt and a nut, or the like, and a means in which an adhesive or the like is combined therewith, or the like, the first fixing portion 25 restricts the movement of the sub plates 22 to the main plate 21 in the plane direction and the thickness direction of the movable table 20. In addition, the sub plates 22 are fixed to the main plate 21 by means of second fixing portions 28 and 29 disposed at the circumferential portion thereof. The second fixing portions 28 and 29 restrict the movement of the sub plates 22 in the thickness direction and allow the same in the plane direction.

In the present embodiment, the sub plates 22 are fixed to the main plate 21 with a wave washer 29 and a screw 28. The surface of the wave washer 29 is fixed in a state leaving the unevenness, so the contacting portion of the wave washer 29 and the head of the screw 28 becomes a linear shape. Since this structure has a small contact area as compared to a case in which a flat washer is used, the movements of the sub plates 22 in the plane direction are allowed.

In this manner, the difference in the positions of the sub plates 22 can be prevented by means of the first fixing portion 25, and the difference in the amounts of deformation of the main plate 21 and the sub plates 22 due to the thermal expansion or the like can be absorbed. Accordingly, bending of the movable table 20 due to the difference in the amounts of deformation of each member is prevented.

In addition, a fixing member for removably fixing the substrate to be processed is installed in the movable table 20.

In the present embodiment, there is adopted a way in which by lowering the pressure between the substrate to be processed and the movable table 20, the substrate to be processed is closely adhered to the movable table 20. As described above, on the top surfaces of the sub plates 22, the concave portions 23 are formed. Absorption holes are formed in the concave portions 23. The adsorption holes pass the inner portion of the first fixing portion 25, penetrate the bottom surface side of the movable table 20 and are connected to a piping 26. The piping 26, for example, is connected to a pressure reducing member (not shown) such as a vacuum pump installed in the stage 60. When the exhausting is performed by the vacuum pump in a state where the substrate to be processed is mounted on the movable table 20, the pressure in the concave portion 23 drops, which causes the difference in the pressures of the top surface side and the bottom surface side (concave portion 23 side) of the substrate to be processed, whereby the substrate to be processed is pressed against and fixed to the movable table 20.

Figure 3A:
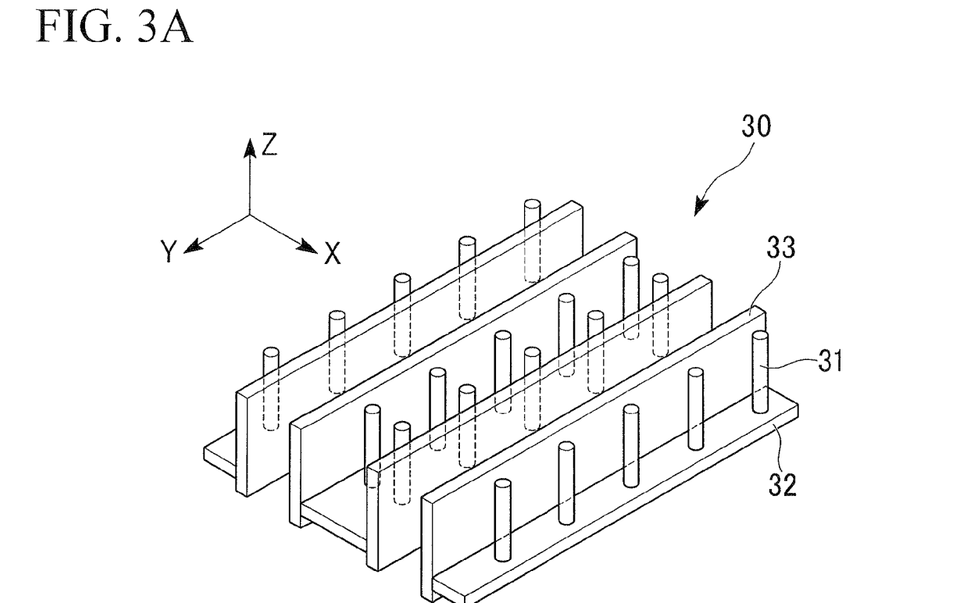
FIG. 3A is an enlarged perspective view that shows a substrate lifting mechanism according to the embodiment.

FIG. 3A is an enlarged perspective view that shows the substrate lifting mechanism 30. The substrate lifting mechanism 30 of the present embodiment is fixed to the bottom side of the first rail 10 in the end portion of the first rail 10. The relative position of the substrate lifting mechanism 30 and the first rail 10 is not changed. As shown in FIG. 3A, the substrate lifting mechanism 30 includes a plurality of lifting pins 31, a plate 32 that supports the bottom surface sides of the lifting pins 31, a driving member 33 that raises and drops the plate 32, and a control member (not shown) that controls the driving member 33 to control the position in the vertical direction of the lifting pin 31.

The driving member 33 of the present embodiment includes four portions which are each installed at both sides of the sub rail 11 and at both sides of the sub rail 12. These four portions are fixed to the sub rails 11 and 12. Two plates 32 connected to each other are installed in the two portions which are positioned outside of the first rail 10. In the two portions which are positioned inside of the first rail 10, one plate 32 connected to both of the two portions is installed. A plurality of lifting pins 31 arranged in the Y direction is installed on each of the plates 32. The arrangements of the lifting pins 31 are identical to those of the through holes 24 of the movable table 20. When the movable table 20 is moved onto the substrate lifting mechanism 30, the through holes 24 are positioned on the lifting pins 31. When the plate 32 is raised by the driving member 33 in this state, it is possible to raise the lifting pins 31 so as to pass through holes 24 up to the upper side of the movable table 20. In this manner, the top surfaces of the raised plurality of lifting pins 31 constitute the surfaces that receive the substrate to be processed which has been transported.

Figure 3B:
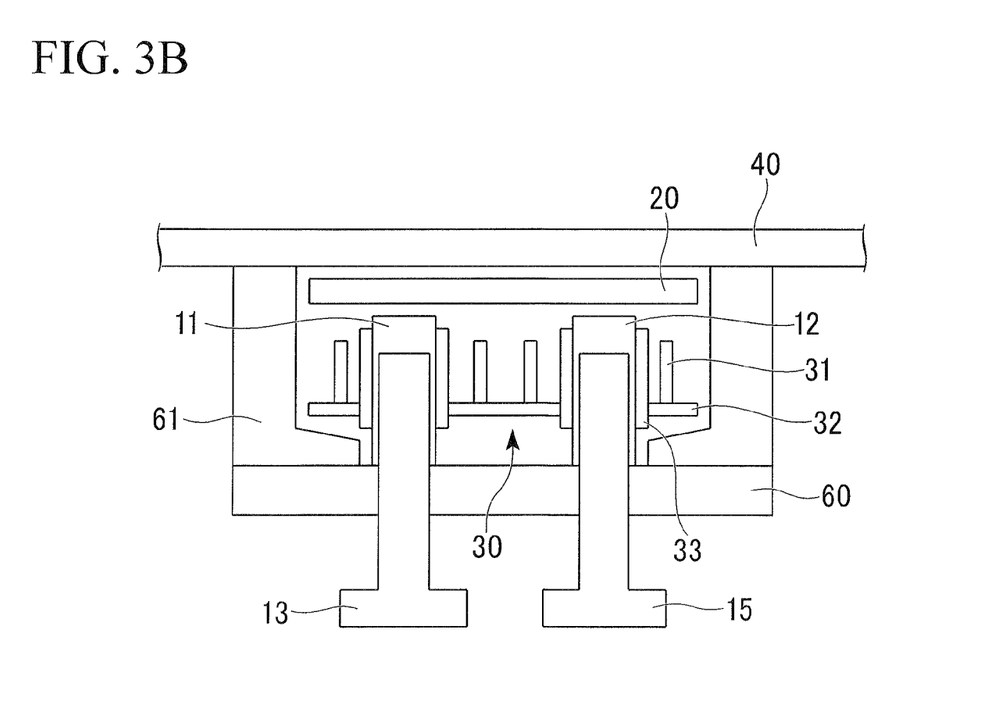
FIG. 3B is a side view of the processing stage according to the embodiment.

FIG. 3B is a side view of the XY stage 100 when seen from the side of the installation of the substrate lifting mechanism 30 in the Y direction. As described above, the stage 60 is installed at the lower side of the first rail 10. The plurality of pillars 61 is installed on the stage 60. Furthermore, the second rail 40 is installed on the pillars 61. The plurality of pillars 61 is disposed at distances at which the movable table 20 can be disposed between the plurality of pillars 61 in the upper portion sides of the pillars 61. In addition, the lower portion sides of the pillars 61 are larger than the upper portion sides thereof and extend to the first rail 10 side further than the upper portion sides. As a result, the amounts of deformation of the pillars 61 due to the weight of the second rail 40 or the like positioned at the upper portion of the pillars 61 can be decreased, which makes it possible to prevent a deterioration of the degree of the position accuracy due to deformation.

(Substrate Process Method)

When the XY stage 100 configured as described above is used, it is possible to satisfactorily perform a predetermined process at a predetermined position of the substrate to be processed. Hereinafter, with reference to FIGS. 4A to 4E, the description will be given to a method of performing the process in the substrate to be processed formed of a glass or the like by means of the liquid droplet discharging apparatus using the XY stage 100. In addition, in FIGS. 4A to 4E, the XY stage 100 or the like is indicated by the side view when viewed along the X direction.

Figure 4A:
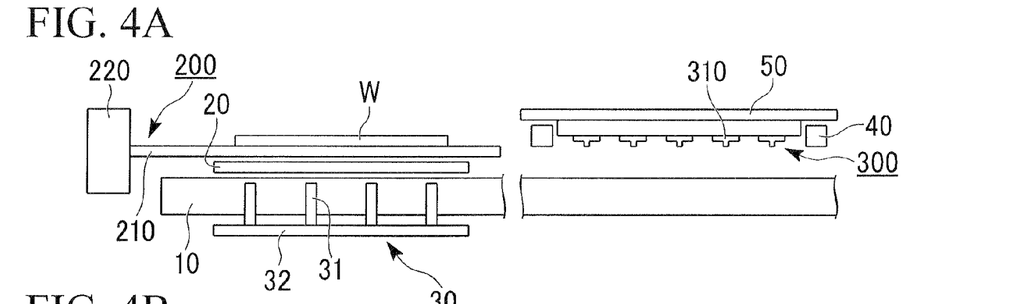
FIG. 4A is a side view showing an example of the usage of the processing stage.

Firstly, as shown in FIG. 4A, the movable table 20 is positioned at the upper side of the substrate lifting mechanism 30. The substrate to be processed W is transported to the upper side of the mounting surface in the movable table 20, for example, by means of a transport robot 200 or the like. Since the substrate lifting mechanism 30 is fixed to the first rail 10, by moving the movable table 20 to a predetermined position on the first rail 10, it is possible to satisfactorily match the positions of the movable table 20 and the substrate lifting mechanism 30. In the process portion 50 which is disposed on the second rail 40, for example, a liquid droplet discharging head (liquid droplet discharging apparatus) 300 including a plurality of liquid droplet discharging nozzles 310 is mounted. In the present embodiment, the liquid droplet discharging head 300 is mounted at the bottom surface side of the process portion 50 such that the liquid droplet discharging nozzles 310 face downward.

The transport robot 200, for example, includes a fork-shaped arm 210 and a control apparatus 220 for controlling the position of the arm 210. The fork-shaped arm 210 has a plurality of support portions which is arranged in parallel to each other and extends in one direction (the Y direction in the present embodiment). These support portions are collectively connected to a connecting member that extends in a direction (the X direction in the present embodiment) perpendicular to the support portion in the end portion of the one side thereof. In addition, the connecting member with the support portion connected thereto is connected to a stem portion which extends in the same direction as the support portion. This stem portion is connected to the control apparatus 220. The substrate to be processed W is mounted on the support portion of the arm 210 of the transport robot 200 and is transported. The position at the time of the transportation of the substrate to be processed W is controlled by the control apparatus 220. In addition, in the present embodiment, the arrangement of the support portion and the arrangements of the through holes 24 are adjusted such that the through holes 24 (see FIG. 2A) of the movable table 20 are positioned between the support portions.

The through holes 24 are disposed so as to avoid the first rail 10. For example, the positions of the support portion of the arm and the sub rails 11 and 12 of the first rail 10 may be made to correspond to each other. In this case, the through holes 24 are disposed so as to avoid the support portion of the arm 210, and the lifting pins 31 are positioned between the plurality of support portions of the arm 210.

Figure 4B:
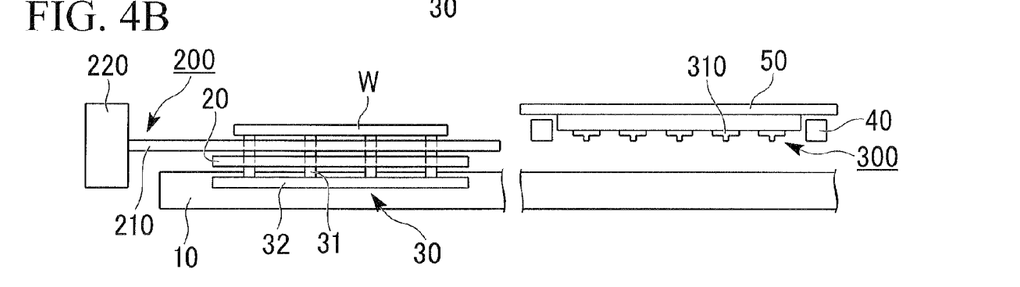
FIG. 4B is a side view showing an example of the usage of the processing stage.

Thereafter, as shown in FIG. 4B, the lifting pins 31 of the substrate lifting mechanism 30 are raised through the through holes 24 of the movable table 20. In addition, the lifting pin 31 is raised up to a position higher than the position in which the substrate to be processed W is supported by the transport robot 200. The substrate to be processed W is hereby supported by the top surfaces of the lifting pins 31. As described above, since the position matching of the movable table 20 and the substrate lifting mechanism 30 can be satisfactorily performed, it is possible to satisfactorily raise the lifting pins 31 without causing a collision of the lifting pins 31 with the movable table 20 in the outer sides of the through holes 24. In addition, since the through holes 24 are positioned between the support portions of the arm 210, the lifting pins 31 passed through the through holes 24 can satisfactorily support the bottom surface side of the substrate to be processed W passing through between the support portions.

Figure 4C:
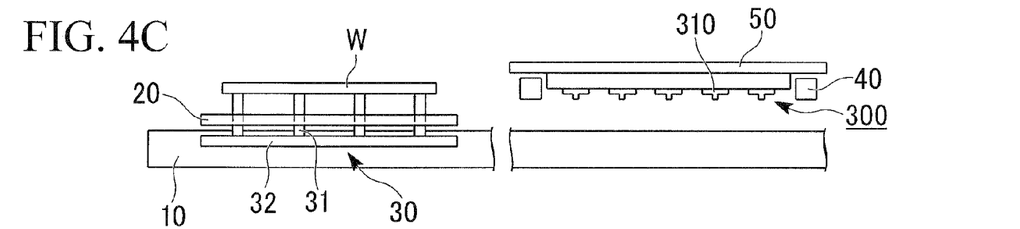
FIG. 4C is a side view showing an example of the usage of the processing stage.

Thereafter, as shown in FIG. 4C, the arm 210 is expelled from the bottom surface side of the substrate to be processed W which is supported by the lifting pins 31. The support portions of the arm 210 extend in the Y direction, so that the lifting pins 31 are positioned between the support portions. For this reason, for example, by moving the arm 210 along the Y direction, the arm 210 can be rapidly expelled, and thus the workability can be improved. In addition, as shown in FIG. 2C, the lifting pins 31 are disposed at the inner side and the outer side of the first rail 10. As a consequence, the substrate to be processed W can be supported by the center portion and the circumferential portion, thus the bending of the substrate to be processed W is decreased.

Figure 4D:
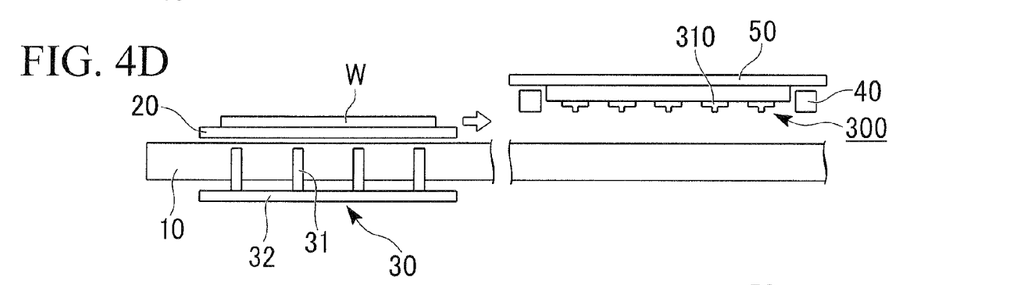
FIG. 4D is a side view showing an example of the usage of the processing stage.

Then, as shown in FIG. 4D, the lifting pins 31 are dropped such that the top surfaces thereof are lower than the bottom surface of the movable table 20. The substrate to be processed W is hereby mounted on the top surface (mounting surface) of the movable table 20. Then, the substrate to be processed W is detachably fixed to the movable table 20 by means of the fixing member. In addition, the first direction control member 17 moves the movable table 20 to a region in which the first rail 10 crosses with the second rail 40, i.e., a process area. As in the present embodiment, according to the structure in which the movable table 20 is independent from the substrate lifting mechanism 30, the movable table 20 is lightened as compared to a movable table with a substrate lifting mechanism. Thus, it is possible to move the movable table 20 at a high speed, so the throughput thereof can be reduced.

In addition, in order to transport the substrate to be processed W to the process area, the movable table 20 with the substrate to be processed W mounted thereon needs to pass under the second rail 40. For this reason, the second rail 40 naturally needs to be arranged at a position higher than the substrate to be processed W. The substrate lifting mechanism 30 is independent from the movable table 20, whereby the movable table 20 is thinned. Thus, the position of the second rail 40 can be lowered as compared to a case where the movable table with the substrate lifting mechanism is used. For example, the movable table having a size of approximately square shape with sides of 2500 mm when seen in plane view has a thickness of about 400 mm in a case where it includes the substrate lifting mechanism. On the other hand, the shape of the movable table 20 of the present embodiment, when seen in plane view, is approximately a square shape with sides of 2500 mm, and the thickness thereof is about 90 mm which is noticeably thin. In the present embodiment, the second rail 40 can be disposed as low as the movable table 20 is thinned. In addition, the pillar 61 (see FIG. 3B) that supports the second rail 40 is also short (the second rail 40 is low). Thus, the amount of deformation due to the weight of the structure portion on the pillar 61 becomes smaller. In addition, the change in the relative positions of the first rail 10 and the second rail 40 due to the deformation is remarkably reduced. Thus, it is possible to precisely control the relative position of the substrate to be processed W and the liquid droplet discharging head 300.

Figure 4E:
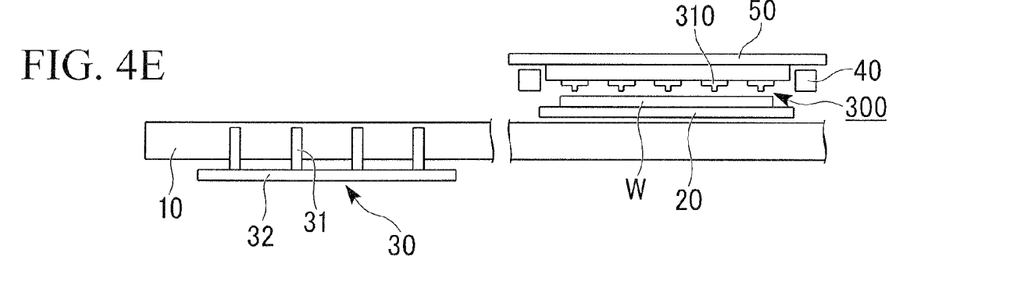
FIG. 4E is a side view showing an example of the usage of the processing stage.

Then, as shown in FIG. 4E, in the above-described process area, the movable table 20 is moved along the Y direction. Simultaneously, the process portion 50 is moved along the X direction, which causes the relative position of the substrate to be processed W and the liquid droplet discharging head 300 to be changed. Simultaneously, the functional liquids such as the liquid materials are discharged from the liquid droplet discharging head 300 so as to arrange the liquids in a predetermined position of the substrate to be processed W. At this time, since the movable table 20 is lightweight as described above, the inertial force of the movable table 20 is small and the position of the movable table 20 can be precisely controlled. Furthermore, since the pillar 61 that supports the second rail 40 is low, the natural frequency thereof becomes high, so a resonance hardly occurs in the pillar 61. Thus, there is no deviation of the position of the liquid droplet discharging head 300 from the predetermined position due to the resonance, and the functional liquids can be accurately discharged from the predetermined position. In this manner, by the use of the XY stage 100, it is possible to precisely control the position of the substrate to be processed W and the position of the liquid droplet discharging head 300. For this reason, it is possible to precisely arrange the functional liquids in the predetermined position of the substrate to be processed W.

Manufacturing Example

Hereafter, an example of the manufacturing method of the movable table 20 will be described. FIGS. 5A to 5E are process diagrams that schematically show the manufacturing method of the movable table 20. In addition, the detailed structures of the first and second fixing portions, the through holes, and the suction openings or the like are omitted from FIGS. 5A to 5E.

Figure 5A:
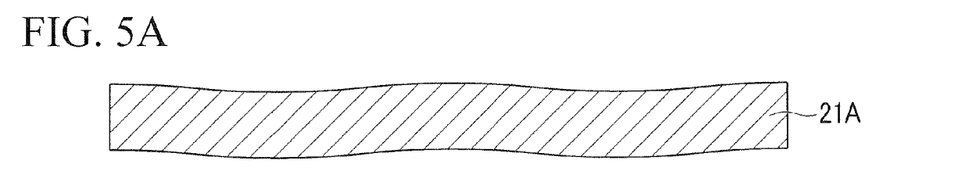
FIG. 5A is a sectional process diagram that schematically shows a manufacturing example of the movable table.

Firstly, as shown in FIG. 5A, a plate-shaped aluminum material 21A having a predetermined size is prepared by cutting or the like. The top surface side and the bottom surface side or the like of the aluminum material 21A are flattened by means of cutting or the like as necessary. The aluminum material 21A thereafter becomes a main plate 21 (see FIG. 2A). In general, the metallic materials such as the aluminum can be worked without causing a division, but because of the heat and the deformation during working, the surface thereof generates the waves after working. For this reason, even when the flattening is performed, it is difficult to set the degree of flatness of the top surface of the aluminum material 21A to be equal to or less than ±50 μm. In the present embodiment, the degree of flatness of the aluminum material 21A is about ±50 μm.

Figure 5B:
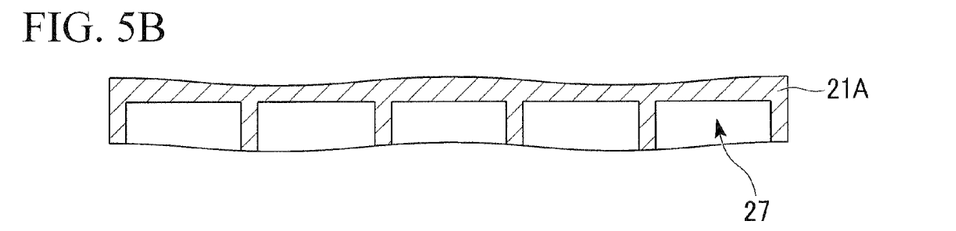
FIG. 5B is a sectional process diagram that schematically shows a manufacturing example of the movable table.

Next, as shown in FIG. 5B, the bottom surface side of the aluminum material 21A is partly thinned so as to form a thin portion 27. As described above, since the metallic material has high workability, the thin portion 27 can be satisfactorily formed. In addition, the installing openings of the first fixing portion 25 and second fixing portions 28 and 29, and a part of the through holes 24 or the like shown in FIG. 2B are formed. Next, the top surface side of the aluminum material 21A is subjected to the surface finishing by means of the polishing or the like. While the fine unevenness on the top surface side can be reduced by means of the polishing, it is difficult to eliminate the large waves because of the above-described reason, so the waves also remain in the present embodiment.

Figure 5C:
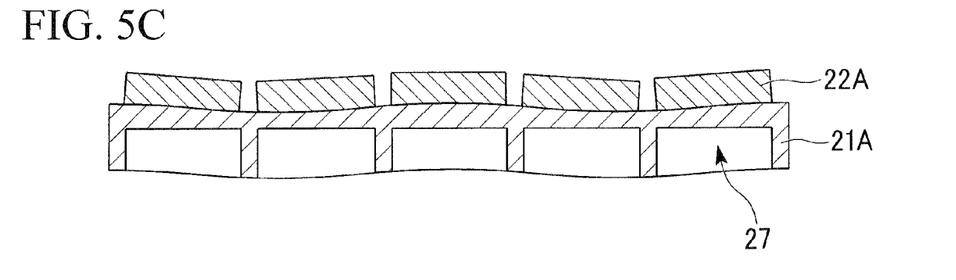
FIG. 5C is a sectional process diagram that schematically shows a manufacturing example of the movable table.

Thereafter, as shown in FIG. 5C, a plate-shaped granite material 22A is installed on the aluminum material 21A with the thin portion 27 formed thereon. The granite material 22A thereafter becomes the sub plate 22 (FIG. 2A). On the granite material 22A, the installing openings of the first fixing portion 25 and the second fixing portions 28 and 29, and a part of the through holes 24 or the like are formed. Next, it is flattened by means of polishing or the like. Since the granite is a material having a hardness higher than aluminum, by performing polishing or the like, the degree of flatness of the granite material 22A can be made higher than that of the aluminum material 21A. In other words, the degree of flatness of the granite material 22A can be set to be less than ±50 μm, so it is set equal to or less than ±25 μm in the present embodiment. A plurality of these granite materials 22A is prepared. In addition, the plurality of granite materials 22A is fixed to the aluminum material 21A by the first fixing portion 25 and the second fixing portions 28 and 29 or the like.

As described above, the waves are generated on the aluminum material 21A. For this reason, if one granite material having essentially the same area as the area of the aluminum material 21A is used, the granite material cannot be satisfactorily installed. For example, the granite material is supported only by the portion which protrudes upward in the aluminum material generating the waves. Then, in the position which is recessed in the aluminum material, the granite material is separated from the aluminum material. In this case, the cracks are easily generated in the granite material. In particular, if the granite material is tightly bonded to the aluminum material, the top surface side of the granite material is polished, or the substrate to be processed is mounted on the movable table which has been manufactured using the granite material, the splits are generated in the granite material. In this case, deterioration in the yield when manufacturing the movable table and inconvenience when using the movable table result.

On the other hand, since the plurality of granite materials 22A is installed in the present invention, the areas of each granite material 22A become small as compared to a case where one granite material is installed. Thus, each of the granite materials 22A becomes relatively small, as compared to the waves of the aluminum material 21A. Then, the plurality of granite materials 22A is each disposed along the inclined surfaces of the waves. Thus, it is possible to satisfactorily install the granite material 22A on the aluminum material 21A.

Figure 5D:
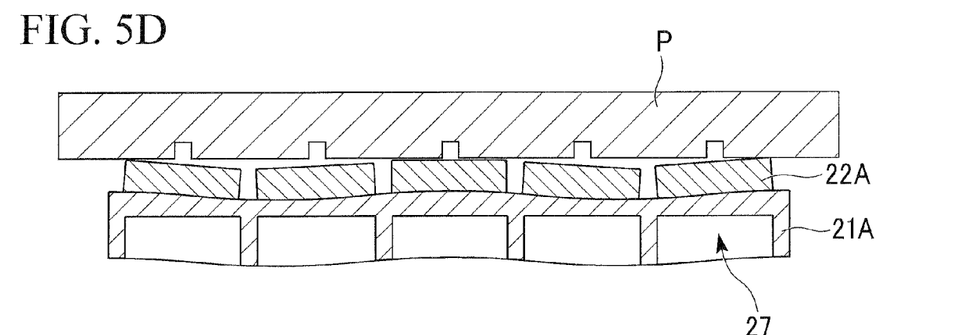
FIG. 5D is a sectional process diagram that schematically shows a manufacturing example of the movable table.
Figure 5E:
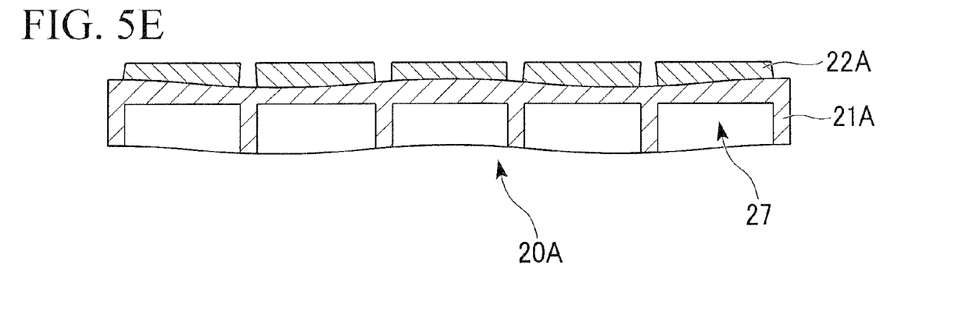
FIG. 5E is a sectional process diagram that schematically shows a manufacturing example of the movable table.

Next, as shown in FIG. 5D, the top surface sides of the plurality of granite materials 22A are collectively polished and flattened. Specifically, for example, a plate-shaped polishing material P, which is formed of the granite material and has the groove portion installed thereon, is rubbed on the plurality of granite materials 22A and polished (brushed). Since the hardness of the granite material 22A is identical to that of the polishing agent P, the mutual convex portions are selectively polished and the mutual degree of flatness becomes high. The degree of flatness of the top surface of the granite material 22A can be hereby made equal to or less than ±15 μm. In the present embodiment, the degree of flatness of the top surface of the granite material 22A is about ±8 μm. In addition, by polishing the granite material 22A in a state where a load similar to at the time of the using thereof is added with respect to the movable table, for example the weight of the movable table is supported similarly to at the time of the using thereof, the degree of flatness at the time of the using can be made more satisfactory. For example, by supporting and polishing the aluminum material 21A on the first rail 10, these effects can be obtained.

As described above, as shown in FIG. 5E, it is possible to form the middle body 20A of the movable table 20 including the plurality of granite materials 22A that is approximately coplanar on the aluminum material 21A having the thin portion 27. By providing the middle body 20A with the piping 26 or the like as shown in FIG. 2B, the movable table 20 can be obtained.

In the movable table in the present invention, it is possible to increase the degree of flatness of the mounting surface of the substrate to be processed in the movable table and lighten the movable table. Thus, in a case where the processing stage of the present invention including the movable table is used, the throughput can be improved by moving the movable table at a high speed, the position of the movable table can be controlled with a high degree of accuracy, and it is possible to correspond to the large size of the substrate. By using the processing stage, it is possible to perform a uniform process on the overall surface of the substrate to be processed, whereby a high quality device can be manufactured at a low cost.

In addition, in the above-described embodiment, the structure in which the movable table 20 is independent from the substrate lifting mechanism 30 has been adopted, but the movable table may include the substrate lifting mechanism, and this movable table can also be lightened by the present invention.

Furthermore, the plane shape of the sub plate 22 may not be square, but may be a triangle, a rectangular, a polygon which is equal to or more than a pentagon, a circle, an oval, or a combined shape thereof, for example, a rectangular shape with curved corners.

Furthermore, as the second fixing portions 28 and 29, in addition to the fixing by the use of the wave washer 29, for example, the main plate 21 and the sub plate 22 may be fixed with screws or the like via a sliding support member such as a bearing.

In addition, while the example of the process apparatus that performs the process in the substrate, the liquid droplet discharging apparatus has been described, the present invention can be applied to various process apparatuses such as various inspecting apparatuses, a laser annealing apparatus, and a light exposing apparatus. Furthermore, in a processing stage in which the movable table 20 moves at least along the first direction, the effects of the present invention can be obtained. For example, the effects of the present invention can be also obtained in a processing stage in which the process portion is fixed and the substrate is subjected to the line process while being moved along the first direction, or a processing stage in which the movable table moves along the first direction and the second direction, which causes the relative position of the substrate and the process portion to be changed and the process to be performed or the like.

INDUSTRIAL APPLICABILITY

According to the present invention, it is possible to increase the degree of flatness of the mounting surface of the substrate to be processed in the movable table and lighten the movable table. Thus, the costs relating to the mechanism for moving the movable table are reduced, which makes it possible to obtain the processing stage at a low cost. In addition, by lightening the movable table, it is possible to move the movable table with a high speed and control the position of the movable table with a high degree of accuracy. As a result, it is possible to obtain the processing stage which can effectively and satisfactorily process the substrate to be processed. Furthermore, the movable table is easily enlarged and the processing stage can correspond to the large substrate.

What is claimed is:

1. A movable table which has a substrate to be processed mounted thereon and moves, comprising:
    a main plate formed of a metallic material;
    a plurality of sub plates which is disposed on the main plate and is formed of a material with a hardness higher than the metallic material, wherein top surfaces of the plurality of sub plates are mounting surfaces of the substrate to be processed;
    each of the plurality of sub plates is fixed to the main plate by a first fixing portion disposed on a center portion of each of the plurality of sub plates, and at a circumferential portion of each of the plurality of sub plates, each of the plurality of sub plates is fixed to the main plate by a second fixing portion so as to restrict a movement of each of the plurality of sub plates in a thickness direction and allow the same in a plane direction; and
    concave portions are formed on the top surfaces of the plurality of sub plates, absorption holes are formed in the concave portions, and each of the adsorption holes passes an inner portion of the first fixing portion, penetrates the bottom surface of the movable table.

2. The movable table according to claim 1, wherein the main plate is formed of an aluminum.

3. The movable table according to claim 1, wherein the sub plates are formed of a granite material.

4. A processing stage comprising:
    a movable table which has a substrate to be processed mounted thereon and moves, comprising:
    a main plate formed of a metallic material;
    a plurality of sub plates which is disposed on the main plate and is formed of a material with a hardness higher than the metallic material, wherein top surfaces of the plurality of sub plates are mounting surfaces of the substrate to be processed;
    each of the plurality of sub plates is fixed to the main plate by a first fixing portion disposed on a center portion of each of the plurality of sub plates, and at a circumferential portion of each of the plurality of sub plates, each of the plurality of sub plates is fixed to the main plate by a second fixing portion so as to restrict a movement of each of the plurality of sub plates in a thickness direction and allow the same in a plane direction; and
    concave portions are formed on the top surfaces of the plurality of sub plates, absorption holes are formed in the concave portions, and each of the adsorption holes passes an inner portion of the first fixing portion, penetrates the bottom surface of the movable table;
    a process portion in which a process apparatus that performs a predetermined process for the substrate to be processed is installed; and
    a position control member which moves at least the movable table so as to change the relative positional relationship of the movable table and the process portion.

5. The movable table according to claim 2, wherein the sub plates are formed of a granite material.

6. A processing stage comprising:
    a movable table which has a substrate to be processed mounted thereon and moves, comprising:
    a main plate formed of an aluminum;
    a plurality of sub plates which is disposed on the main plate and is formed of a material with a hardness higher than the an aluminum, wherein top surfaces of the plurality of sub plates are mounting surfaces of the substrate to be processed;
    each of the plurality of sub plates is fixed to the main plate by a first fixing portion disposed on a center portion of each of the plurality of sub plates, and at a circumferential portion of each of the plurality of sub plates, each of the plurality of sub plates is fixed to the main plate by a second fixing portion so as to restrict a movement of each of the plurality of sub plates in a thickness direction and allow the same in a plane direction; and
    concave portions are formed on the top surfaces of the plurality of sub plates, absorption holes are formed in the concave portions, and each of the adsorption holes passes an inner portion of the first fixing portion, penetrates the bottom surface of the movable table;

a process portion in which a process apparatus that performs a predetermined process for the substrate to be processed is installed; and a position control member which moves at least the movable table so as to change the relative positional relationship of the movable table and the process portion.

* * * * *